United States Patent [19]

Jacobs

[11] Patent Number: 5,155,743
[45] Date of Patent: Oct. 13, 1992

[54] DIGITAL DATA CONVERTER

[75] Inventor: Gordon M. Jacobs, Oakland, Calif.

[73] Assignee: Nuance DesignWorks, Inc., Oakland, Calif.

[21] Appl. No.: 819,615

[22] Filed: Jan. 9, 1992

Related U.S. Application Data

[63] Continuation-in-part of Ser. No. 618,812, Nov. 27, 1990, abandoned.

[51] Int. Cl.[5] ............... H04B 14/04; H04B 14/06
[52] U.S. Cl. .................................. 375/28; 375/26; 375/29; 375/30; 341/77
[58] Field of Search .................. 375/25, 26, 27, 28, 375/29, 30; 341/77

[56] References Cited

U.S. PATENT DOCUMENTS

| | | | |
|---|---|---|---|
| 4,196,448 | 4/1980 | Whitehouse et al. | 375/28 |
| 4,301,446 | 11/1981 | Petit | 341/143 |
| 4,493,091 | 1/1985 | Gundry | 375/30 |
| 4,588,981 | 5/1986 | Senn | 375/33 |
| 4,700,361 | 10/1987 | Todd et al. | 375/25 |
| 4,700,362 | 10/1987 | Todd et al. | 375/30 |
| 4,783,644 | 11/1988 | Kilchsperger | 375/28 |

OTHER PUBLICATIONS

K. J. Gundry, "An Audio Broadcast System Using Delta Modulation", SMPTE Journal, vol. 94, No. 11, Nov. 1985, pp. 1185-1190.
C. C. Todd, "Efficient Digital Audio Coding and Transmission Systems", Proceedings of the 39th Annual Broadcast Engineering Conference, Las Vegas, Nev., 1985, pp. 386-394.
"NE5241 Dobly ADM Digital Audio Decoder Data Sheet", Signetics Corporation, Sunnyvale, Calif., Mar. 1989.
N. S. Lin, B. Fraenkel, G. M. Jacobs, L. Yiu, D. Senderowicz, and R. Ulmer, "Sigma-Delta A/D and D/A for High Speed Voiceband Modems", Proc. of ICASSP, Glasglow, Scotland, May 1989.
M. W. Hauser and R. W. Brodersen, "Circuit and Technology Considerations for MOS Delta-Sigma A/D Converters", Proc. of ISCAS, May 1986, pp. 1310-1315.
D. Defraeye, D. Rabaey, W. Roggeman, J. Yde, and L. Kiss, "A 3-$\mu$m CMOS Digital Codec with Programmable Echo Cancellation and Gain Setting", IEEE J. of Solid State Ckts, vol. SC-20, No. 3, Jun. 1985, pp. 679-687.
J. C. Candy, "A Use of Double Integration in Sigma-Delta Modulation", IEEE Trans. on Communications, vol. COM-33, No. 3, Mar. 1985, pp. 249-258.
J. C. Candy, "A Use of Limit Cycle Oscillation to Obtain Robust Analog-to-Digital Converters", IEEE Trans. on Communications, vol. COM-22, No. 3, Mar. 1974, pp. 298-305.

Primary Examiner—Curtis Kuntz
Assistant Examiner—Young Tse

[57] ABSTRACT

A decoder for recovering an analog signal from its digital representation produced by an encoder employing adaptive-delta-modulation first decodes audio bit-stream (17) in the digital domain with digital delta demodulation (15), to a pulse-code-modulation (PCM) format digital signal. Post-processing (35), complementary to encoder processing is performed digitally on the PCM signal. The output from post-processor (35) is up-sampled, and using delta modulation, a noise shaped single-bit highly oversampled output is produced by converter (14). Applying the single-bit output to low-pass filter (11) re-constructs the decoded analog signal, which is audio output (12). By fully exploiting digital signal processing techniques, the decoder can be manufactured at low cost and exceed the performance of existing analog implementations.

31 Claims, 10 Drawing Sheets

FIG._1

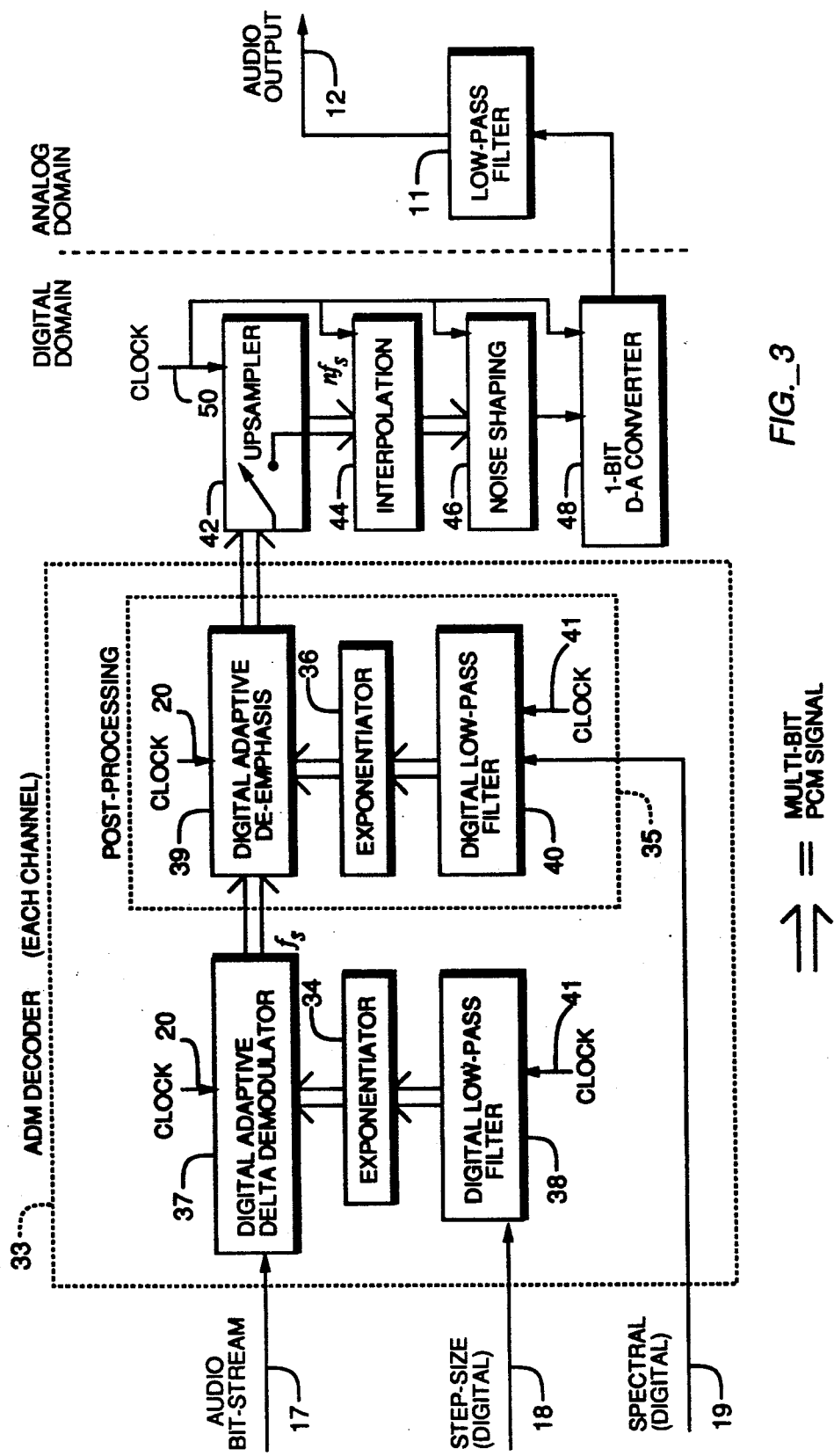
FIG._3

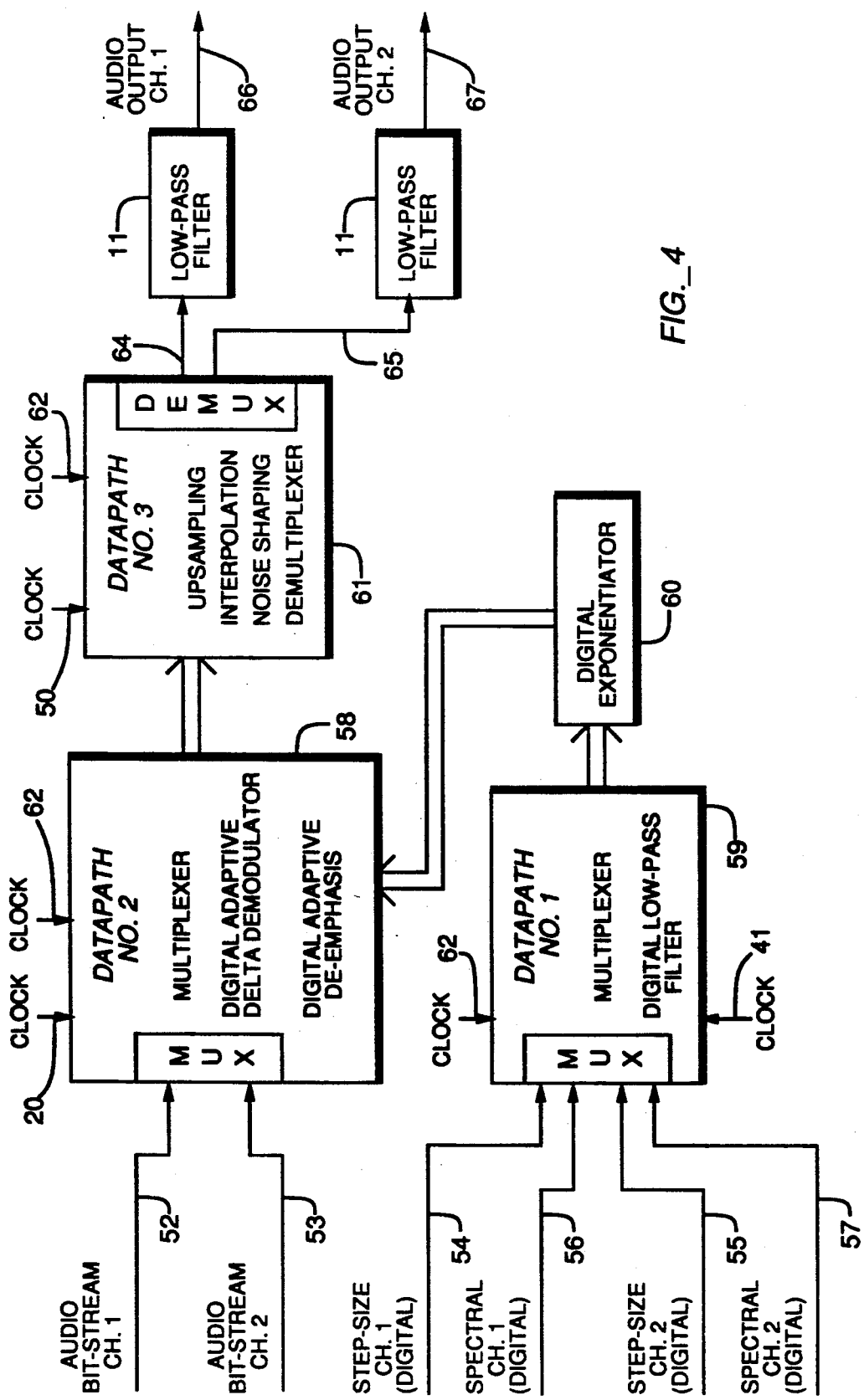

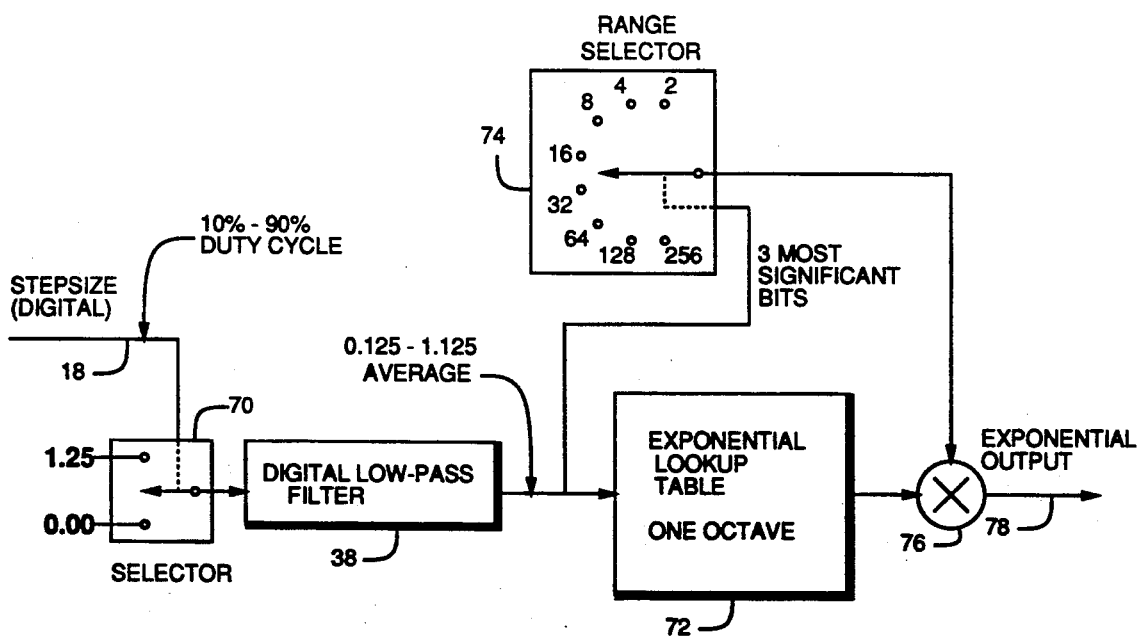
FIG._5

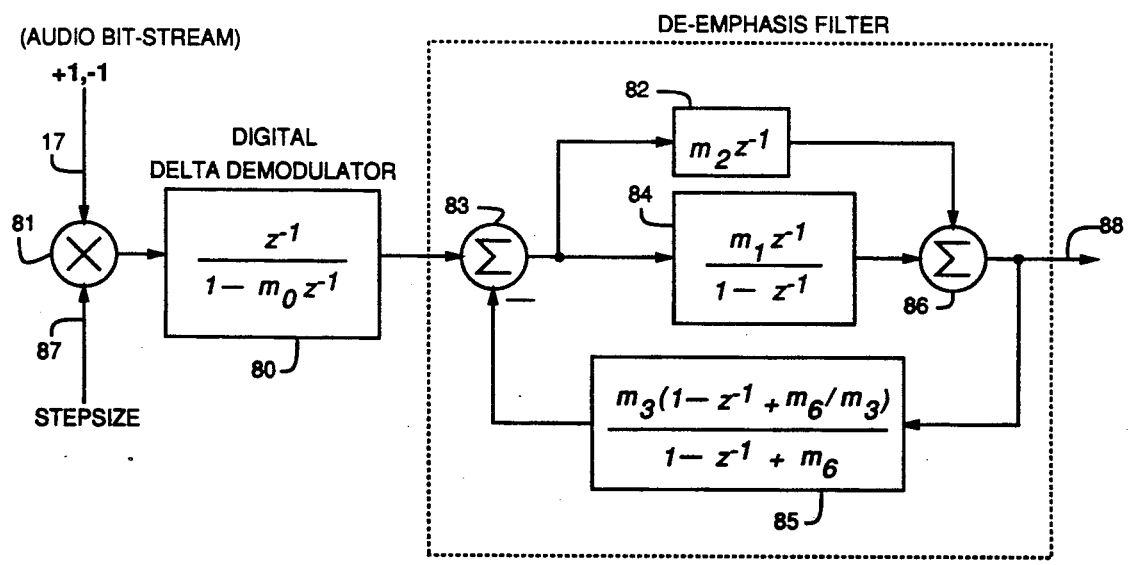
FIG._6

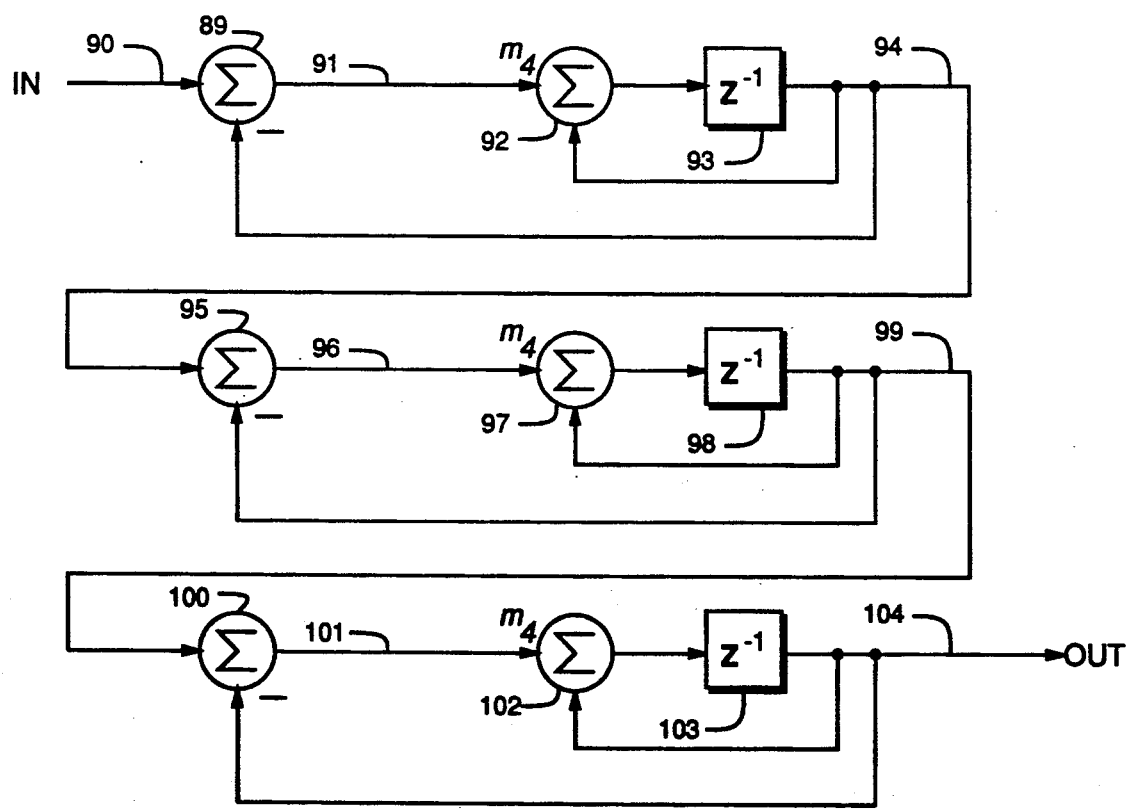
FIG._7

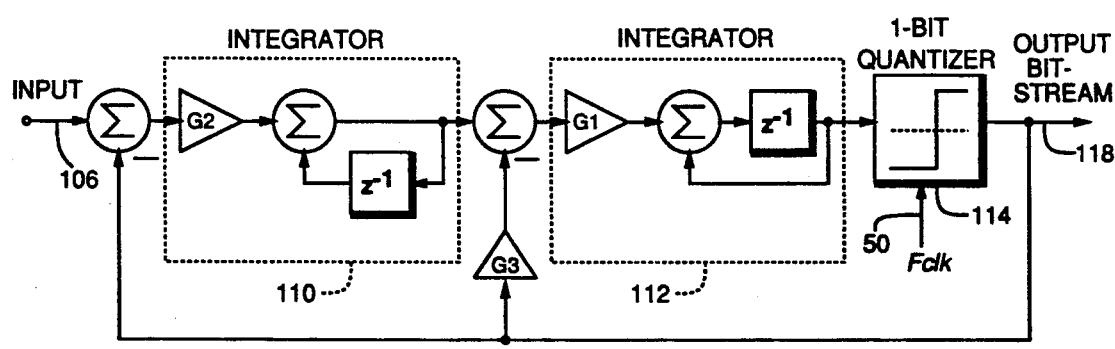
FIG._8

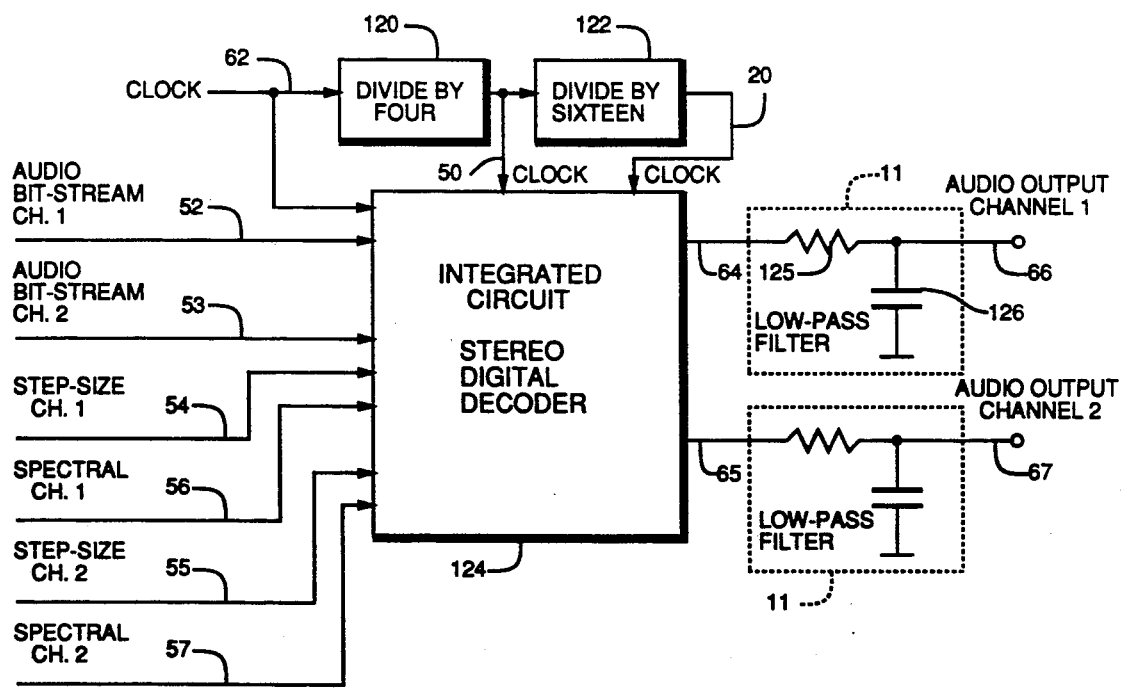
FIG._9

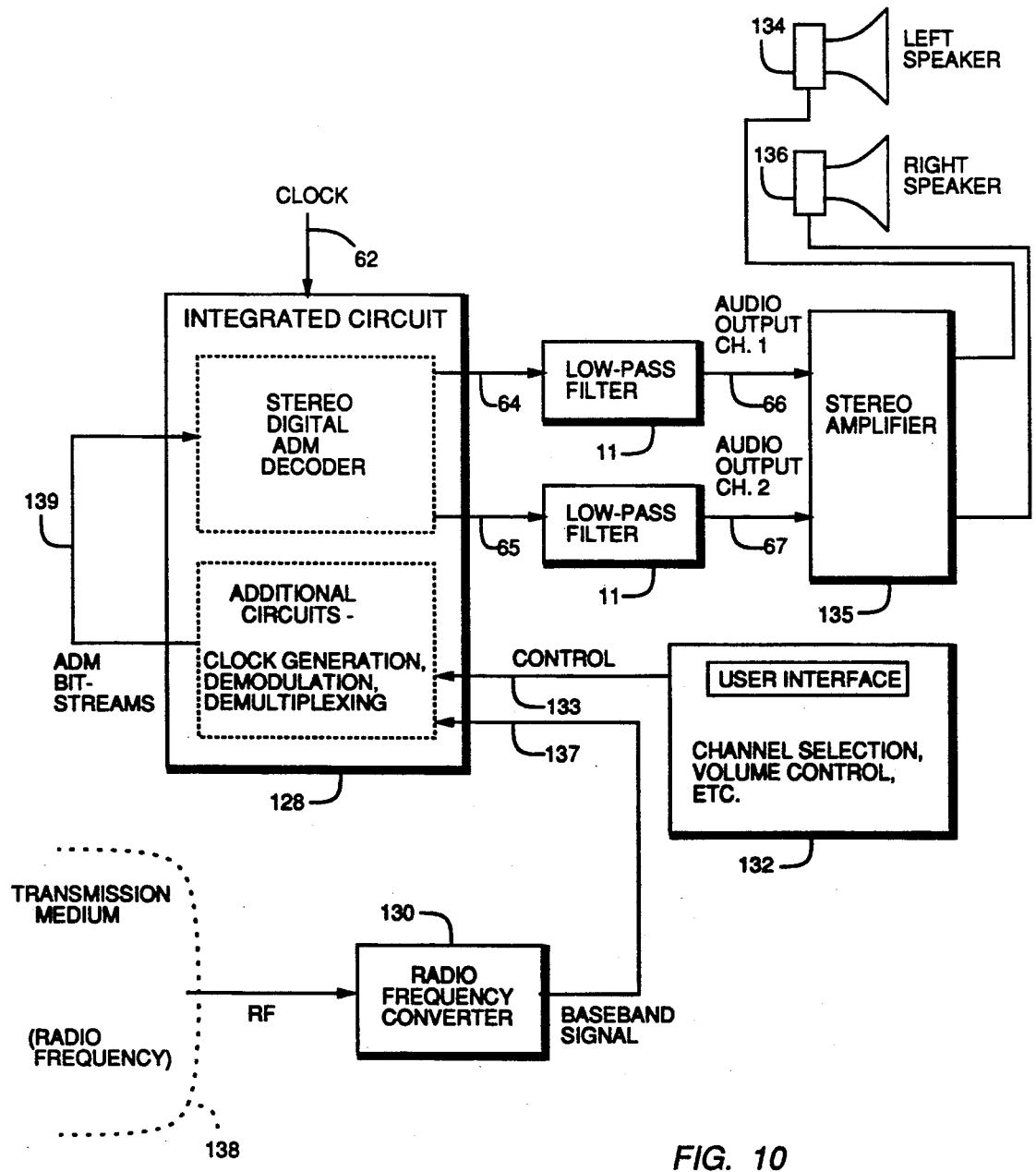
FIG._10

DIGITAL DATA CONVERTER

This is a continuation-in-part of Ser. No. 07/618,812, filed Nov. 27, 1990, now abandoned.

BACKGROUND

1. Field of Invention

This invention relates in general to electronic decoding systems, and specifically to a method for conversion of digitally encoded delta modulated signals to analog form.

2. Prior Art

The goal of a common broadcast system is to take an audio or video signal from a broadcast center, (e.g. voices, music, and/or pictures) and distribute it via a transmission medium (e.g. air, coaxial cable) to a large number of people possessing receivers that can reconstruct the original signal. Consistently high performance can be achieved by encoding the signal digitally before transmission. Digital encoder-decoder schemes, such as linear Pulse Code Modulation (PCM) systems, have good performance for audio applications when the sample rate is greater than about 32 kHz, and each sample is represented by digital words of at least 14 bits. In a linear PCM representation, the quantization levels of the sampled signal are uniformly spaced, so each 14-bit sample represents one of $2^{14}$ equally spaced levels which is closest to the sampled value of the analog signal. The sample rate times the number of bits per sample, or the equivalent bit-rate for good quality audio which is PCM encoded is quite high for broadcast applications however, and PCM signals are not very tolerant of errors that might occur during transmission. Error correction can be employed, but this raises the bit-rate even further. Until several years ago, the implementation of PCM decoders required high precision components, making the decoders very expensive for consumer applications.

ADAPTIVE DELTA MODULATION

Adaptive Delta Modulation (ADM) is an alternative digital encoding-decoding scheme where the decoder hardware is simplified, making it attractive for consumer applications. In linear delta modulation, the analog signal is oversampled, i.e. sampled at a rate that is much higher than needed for a correct digital representation. The samples are single bits however, unlike the multi-bit representation in PCM. Each bit represents the difference between the input signal and a "predictor" of the signal, which is formed by an integrator in a first order delta modulator. The integrator adds or subtracts a reference voltage or "stepsize" each cycle of the sample clock, the sign being determined by the sign of the difference between the predictor and the input signal. Therefore, each bit from the delta modulator indicates whether the integrator is above or below the analog signal. The decoder is very simple, consisting of another integrator and reference, to effectively re-create the predictor for the original signal. Adaptive delta modulation improves on this basic operation by varying the stepsize to better match the slope of the analog signal, since a fixed stepsize will tend to be too small for some signals, and too large for others, making the prediction poor. A delta modulator can also be considered a "noise shaper", because the spectrum of the quantization noise of the single-bit bit-stream output has a rising characteristic with rising frequency.

Todd and Gundry, U.S. Pat. No. 4,700,361 (1987) and Todd and Gundry, U.S. Pat. No. 4,700,362 (1987) entitled "Spectral Emphasis and De-emphasis" and "A-D Encoder and D-A Decoder System" respectively, describe a digital encoding-decoding system which employs ADM and is suitable for the transmission of high quality audio signals. It is also described in K. J. Gundry, "An Audio Broadcast System using Delta Modulation," *SMPTE Journal*, Vol. 94, No. 11, November 1985, pp. 1185–1190, and C. C. Todd, "Efficient Digital Audio Coding and Transmission Systems," *Proc. of 39th Annual Broadcast Engineering Conference*, Las Vegas, Nev., 1985, pp. 385–394. The system is targeted specifically for consumer applications, where the price and complexity of the decoder portion of the system is extremely cost sensitive. The encoder portion is more complex and costly, which is appropriate, since it resides only in the relatively few broadcast centers. The transmission bit-rate of the ADM system described in the Todd and Gundry patents is lower than required if PCM is employed to obtain the same level of performance. Also, the ADM system is tolerant of bit errors during transmission, which eliminates the need for error correction.

In the Todd and Gundry system, an audio bandwidth (20–20 kHz) signal is encoded into three separate bit-streams. An adaptive delta modulator produces an oversampled single-bit bit-stream with a clocking rate typically between 10–20 times the upper bandwidth of the audio signal. The stepsize of the delta modulator is adapted to track the audio signal under changing conditions and it is encoded in a second bit-stream. Finally, the shape of a variable spectral emphasis filtering applied to the audio signal before modulation, for the purpose of noise reduction, is encoded into a third bit-stream. The duty of the decoder in the system is to process all three bit-streams and convert them back into an audio signal that closely matches the original signal sent to the encoder's input. This involves delta demodulation (by an integrator) with the decoded stepsize values and spectral de-emphasis filtering. One of the advantages of this ADM system is that the decoding circuitry is relatively simple (in relation to a PCM scheme, for example) which helps in keeping the cost of the consumer decoder low. Note that, while the system of Todd and Gundry uses ADM as a basis for the digital encoding and decoding of the audio signal, significant extra signal processing, such as the spectral emphasis and de-emphasis, is included to extend the performance for high quality audio.

ADM DECODER OPERATION

In the ADM decoder of the Todd and Gundry patents, the adaptive delta demodulation is performed by a single analog integrator with leakage (i.e. the gain of the integrator at D.C. is not infinite) that is fed by pulses with a height equal to the stepsize. To be precise, the leakage on the integrator causes the decoding to actually be what is known in the field as "sigma-delta demodulation". Since the output of the analog integrator is continuously variable, the decoder therefore converts the audio bit-stream to analog format as the first step. Both the stepsize and spectral bit-streams are also converted to analog values as the first step. Post-processing circuits following the integrator, including de-emphasis filtering, must be performed in the analog domain with high quality components to preserve the original signal quality. The stringent demands on the analog circuitry following delta demodulation make the manufacture of the decoder more costly. In an alternative scheme, a fixed stepsize is used in the delta demodulator and the multiplication by the stepsize is performed after the post-processing. While this arrangement reduces the dynamic range requirements of the post-processing circuitry, the analog multiplication is in itself a precision operation requiring costly components. These patents recommend this latter scheme only for professional systems due to its higher cost.

The accuracy of the de-emphasis filtering affects how the ADM decoder will conform to the system specifications. The Todd and Gundry system performs the de-emphasis filtering, as well as filtering required for the stepsize and spectral bit-streams, in the analog domain. Obtaining accurate analog filters in the production of decoders is also costly, since high tolerance components must be used. Testing of the decoders to ensure that they meet the desired specifications is required, which adds further to the production expense. Finally, analog filters rely on components which are subject to aging effects, and may cause the decoder performance to drift over time.

DISCRETE COMPONENT ADM DECODER

The Todd and Gundry patents show an example of a decoder circuit which uses discrete components, such as resistors, capacitors, bipolar transistors, and operational amplifiers. While the delta demodulator itself is extremely simple compared to a PCM converter with similar performance, the additional post-processing mentioned above requires a number of other components, and the use of such a discrete component implementation of the decoder is in fact impractical in many real systems due to its cost and complexity. In fact, the benefits over PCM are reduced in the decoder implementation because, due to the widespread use of PCM in the field, more low-cost integrated circuits exist to perform the PCM decoding function. Hence, a low-cost integrated circuit equivalent of the ADM decoder in the preferred embodiment of Todd and Gundry's, second ('362) patent is a realistic and minimum requirement for a consumer application. The Todd and Gundry ADM system indeed saw little market acceptance when it was introduced because of the lack of such an integrated circuit decoder.

INTEGRATED CIRCUIT ADM DECODER

"NE5241 Dolby ADM Digital Audio Decoder Data Sheet", Signetics Corporation, Sunnyvale, Calif., March 1989, reports an integrated circuit (chip) implementation of the Todd and Gundry system ADM decoder that combines all of the active circuitry required for two audio channels onto a single silicon chip. Although the chip reduces the complexity of an ADM decoder over a discrete implementation, there are still several deficiencies. The prior-art decoder chip is processed in an integrated circuit technology that incorporates bipolar transistors. It is not possible, however, to obtain accurate R-C time constants in production with such a process. Therefore, all of the components in the decoder which define filtering poles and zeros, and other important time constants, must be external to the chip. These external components must maintain a close tolerance for consistent performance among decoders. A total of about 40 external components are required to implement a stereo ADM decoder with this chip, making the manufacture and test still costly, and limiting the performance matching to specifications between different decoders. The amount of physical space required for a decoder is large too, due to the area of printed circuit board used by the numerous discrete external components. Additionally, since the chip follows the prior-art block embodiment of the decoder of the Todd and Gundry patents, the digital bit-streams are all converted to analog signals in the first stage, requiring the following circuitry to have a performance level that exceeds that of the decoded audio signal in order to avoid any degradation in the system performance. The higher performance translates to more cost in the production of the integrated circuit, and therefore, the decoder itself.

To obtain two channels of decoding for stereo applications, the prior-art chip repeats the analog circuitry for a single channel twice. The coexistence of the two channels on the same die causes crosstalk to occur between channels, which is not desirable in high quality audio systems.

COMPATIBILITY WITH TRANSMISSION SYSTEM

The target application of the prior-art ADM system described is a digital audio transmission system. A receiver in such a system includes a number of other functions for demodulating the digital signal that comes from the transmission medium. Normally there are a plurality of audio channels being sent simultaneously, and these must be demultiplexed before the audio is actually decoded. ADM decoding is actually the very last link of the chain in the receiver. The other functions of the receiver are largely confined to the digital domain, again requiring integration for cost reduction. The ADM decoder integrated circuit described above is manufactured in a process that is suitable only for analog circuits. Therefore, there is no possibility of combining the ADM decoding function as implemented by the prior-art decoder chip, along with other important system receiver functions. The inability to combine these circuits places a lower limit on the receiver complexity, size, and cost.

In summary, the cost of the decoder in the ADM system described remains an obstacle in the economic desirability of digital transmission systems for which it is targeted. Prior implementations of the decoder use either discrete components, or a bipolar analog integrated circuit, which still requires a substantial number of external components for determining filter time constants. Consistent performance is difficult to achieve, and the cost of manufacture and test of such decoders is high. The process technology for the integrated circuit prior-art decoder does not support including digital circuits normally required for other system functions, limiting the level of integration, space requirements, and lowest possible cost for the system receiver. Acceptance of the ADM system since the invention was revealed has been limited, in part, by these drawbacks.

OBJECTS AND ADVANTAGES

Accordingly, several objects and advantages of this invention are:

(a) to reduce the manufacturing costs of ADM decoders.

(b) to obtain the reduced costs for manufacturing ADM decoders without penalties in system performance, (c) to reduce the number of components necessary for implementing an ADM decoder and hence, the space and electric power required for the circuitry, (d) to implement an ADM decoder for several audio channels on a single integrated circuit, (e) to implement an integrated circuit ADM decoder using a digital process technology suitable for inclusion of other digital functions on the same integrated circuit, (f) to implement an ADM decoder using circuitry which can be shared between several channels with no crosstalk concerns, hence increasing the efficiency of the implementation and further reducing the cost of manufacture, and (g) to enhance the testability and long term stability of an ADM decoder.

Further objects and advantages of this invention will become apparent from a consideration of the drawings and ensuing description of it.

BRIEF DESCRIPTION OF THE DRAWINGS

FIG. 3 is a block embodiment of an ADM decoder according to the invention which uses digital circuits for performing a function that closely matches that of the decoder shown in FIG. 2.

FIG. 4 is a block diagram of the preferred embodiment of an integrated circuit ADM decoder which further exploits the sharing of digital hardware to perform the decoding of two separate audio channels on a single set of hardware modules.

FIG. 5 is an illustration of the circuitry generating the digital stepsize control signal from the stepsize bit-stream in the preferred embodiment of this invention, showing a technique that reduces the complexity of the exponentiator function.

FIG. 6 is a diagram of a digital network which performs the adaptive delta-demodulation and adaptive de-emphasis function of the preferred embodiment of this invention.

FIG. 7 is a diagram of a digital network which performs the low-pass filtering on the stepsize and spectral bit-streams of the preferred embodiment of this invention.

FIG. 8 is a diagram of a second-order sigma-delta noise shaping circuit that is suitable for the noise shaping portion of the invention.

FIG. 9 is a schematic drawing of an ADM decoder employing the preferred integrated circuit embodiment of the invention, which shows the small number of required external components.

FIG. 10 is a block diagram of a receiver in a digital transmission system, where a digital ADM decoder according to the invention is placed on the same chip as additional circuitry used in the system receiver functions.

SUMMARY OF THE INVENTION

Figure 1:
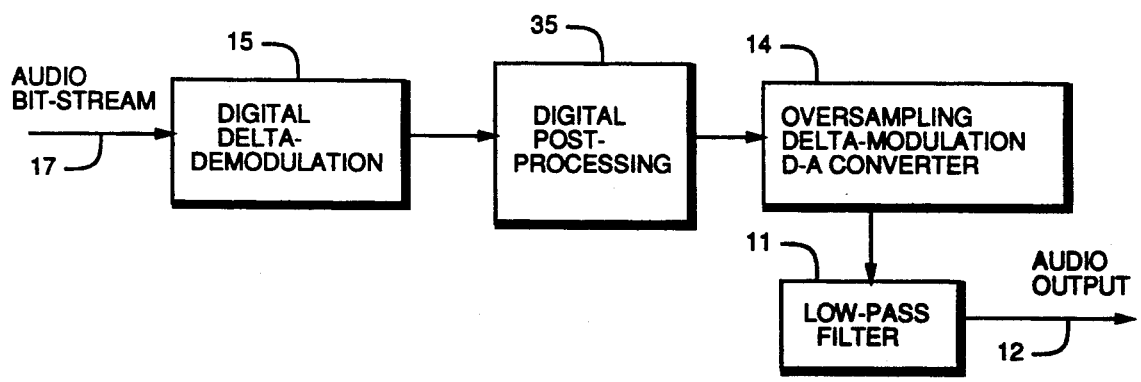
FIG. 1 shows a block diagram of a system for digital data conversion of this invention.

The deficiencies of the prior-art ADM decoder implementations described above are eliminated by performing all of the decoding and post-processing functions of the ADM signal in the digital domain before the signal is converted back to analog form. FIG. 1 shows a block diagram of the process used, which decodes an ADM signal with mostly digital circuitry. The delta demodulation is performed first, by digital demodulation means 15, which converts single-bit ADM audio bit-stream 17 to a multi-bit PCM format as the first step. Post-processing functions are performed on the PCM signal with digital post-processor 35. After delta demodulation and post-processing, delta modulation can be exploited again to encode the PCM digital signal, such that its noise spectrum is shaped sufficiently to use a very simple final digital-to-analog (D-A) converter circuit. Oversampling delta modulation D-A converter 14 modulates the output of post-processor 35 to produce a single-bit bit-stream at a higher frequency, with the desired noise shaping. The output of converter 14 is produced by a single-bit D-A converter requiring no precision analog parts. Simple output low-pass filter 11 is applied to output of converter 14 and acts to re-construct the decoded analog signal by removing images of the audio signal at multiples of the higher output sample rate, and attenuating quantization noise above the audio band. The low-pass filter output is audio output 12.

While the architecture of FIG. 1 seems to trade one type of (D-A) conversion responsibility (delta demodulation) for another (PCM conversion), there are advantages to doing so within the boundaries of the decoder sub-system itself. Though an ADM system target bit-rate is geared towards being low enough for transmission over a medium, the bit-rate internal to the decoder is more or less arbitrary within the constraints of the speed of the circuits used. Oversampling delta modulation D-A converter 14 achieves the required performance by taking full advantage of delta modulation and a higher sample rate to do PCM conversion with modest circuitry requirements. This allows all of the ADM decoding functions and post-processing to be performed digitally, circumventing the problems of an analog ADM decoder.

| DRAWING REFERENCE NUMERALS | |
|---|---|
| | 11 LOW-PASS FILTER |
| 12 AUDIO OUTPUT | |
| 14 OVERSAMPLING D-A CONVERTER | 15 DIGITAL DELTA DEMODULATOR |
| | 17 AUDIO BIT-STREAM |
| 18 STEPSIZE BIT-STREAM | 19 SPECTRAL BIT-STREAM |
| 20 AUDIO BIT-RATE CLOCK | |
| 22 ADAPTIVE DELTA DEMODULATOR | 23 STEPSIZE D-A CONVERTER |
| 24 ADAPTIVE DE-EMPHASIS FILTER | 25 ANALOG POST-PROCESSING |
| 26 EXPONENTIATOR FOR STEPSIZE | 27 SPECTRAL D-A CONVERTER |
| 28 EXPONENTIATOR FOR SPECTRAL | |
| 30 STEPSIZE BANDWIDTH LIMITATION | |
| 32 SPECTRAL BANDWIDTH LIMITATION | 33 DIGITAL ADM DECODING |
| 34 STEPSIZE DIGITAL EXPONENTIATOR | 35 DIGITAL POST-PROCESSING |
| 36 SPECTRAL DIGITAL EXPONENTIATOR | 37 DIGITAL ADAPTIVE DELTA DEMOD. |
| 38 STEPSIZE DIGITAL LOWPASS FILTER | 39 DIGITAL ADAPTIVE DE-EMPHASIS |
| 40 SPECTRAL DIGITAL LOWPASS FILTER | 41 DIGITAL LP FILTER CLOCK |

-continued

DRAWING REFERENCE NUMERALS

42 UPSAMPLER
44 INTERPOLATION
46 NOISE SHAPING
48 1-BIT D-A CONVERTER
50 CLOCK FOR UPSAMPLING
52 CH. 1 AUDIO BIT-STREAM
54 CH. 1 STEPSIZE BIT-STREAM
56 CH. 1 SPECTRAL BIT-STREAM
58 DATAPATH No. 2
60 DIGITAL EXPONENTIATOR
62 CLOCK FOR DATAPATHS
64 CH. 1 D-A OUT
66 CH. 1 AUDIO OUTPUT
70 SELECTOR FOR SCALING
72 EXPONENTIAL LOOKUP TABLE
74 RANGE SELECTOR
76 RANGE MULTIPLIER
78 EXPONENTIATOR OUTPUT
80 DIGITAL LEAKY INTEGRATOR
82 SCALED DELAY
84 DIGITAL INTEGRATOR
86 ADDER
88 DIGITAL DE-EMPHASIS OUTPUT
90 LOW-PASS FILTER INPUT
92 ADDER
94 FIRST STAGE OUTPUT
96 ADDER OUTPUT
98 DELAY
100 ADDER
102 ADDER
104 THIRD STAGE OUTPUT
106 NOISE SHAPER INPUT
110 FIRST DIGITAL INTEGRATOR
112 SECOND DIGITAL INTEGRATOR
114 1-BIT QUANTIZER
118 NOISE SHAPER OUTPUT
120 ¼ CLOCK DIVIDER
122 1/16 CLOCK DIVIDER
124 STEREO DIGITAL ADM DECODER
126 LP FILTER CAPACITOR
128 MULTI-FUNCTION INTEGRATED CKT.
130 RADIO FREQ. CONVERTER
132 USER INTERFACE
134 LEFT LOUDSPEAKER
136 RIGHT LOUDSPEAKER
138 TRANSMISSION MEDIUM

53 CH. 2 AUDIO BIT-STREAM
55 CH. 2 STEPSIZE BIT-STREAM
57 CH. 2 SPECTRAL BIT-STREAM
59 DATAPATH No. 1
61 DATAPATH No. 3

65 CH. 2 D-A OUT
67 CH. 2 AUDIO OUTPUT

81 STEPSIZE MULTIPLIER
83 ADDER
85 1-POLE LOWPASS FILTER

89 ADDER
91 ADDER OUTPUT
93 DELAY
95 ADDER
97 ADDER
99 SECOND STAGE OUTPUT
101 ADDER OUTPUT
103 DELAY
105 FEEDBACK FILTER ADDER

125 LP FILTER RESISTOR

133 CONTROL INFORMATION
135 STEREO AMPLIFIER
137 BASEBAND SIGNAL
139 ADM BIT-STREAMS

DETAILED DESCRIPTION

PRIOR ART ADM DECODER—FIG. 2

Figure 2:
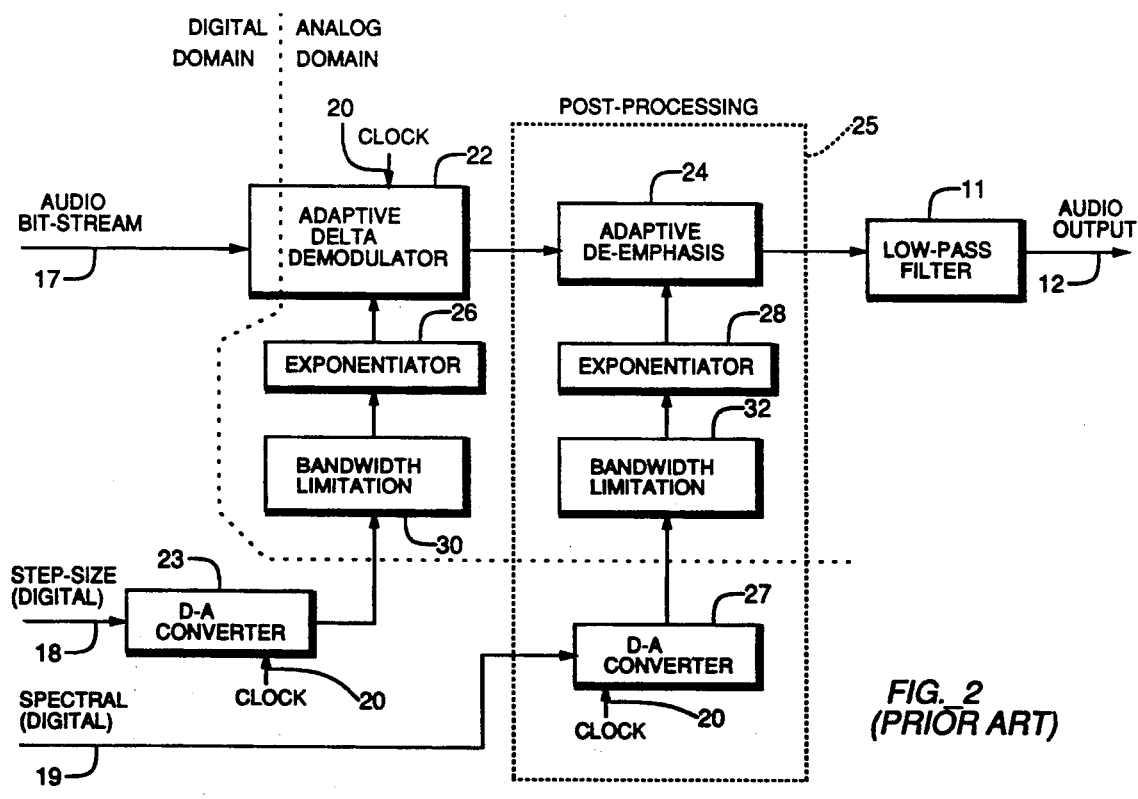
FIG. 2 shows a block embodiment of a prior-art ADM decoder which performs processing mostly in the analog domain.

It is instructive to examine a prior-art ADM system decoder at this point in order to understand the advantages and operation of the digital implementation being presented. FIG. 2 shows a block diagram of a prior-art ADM decoder with the boundary between the analog and digital domains emphasized.

Adaptive delta-demodulator 22 is an analog integrator which integrates an amount of charge for each cycle of clock 20 which is proportional to a stepsize. The integrator has the transfer function:

$$\frac{1}{1 + sT_0} \tag{1}$$

where $T_0$ is 0.5 msec and $s$ is the complex frequency in the analog domain. For each cycle of clock 20, the integrator is fed by a current pulse equal to plus or minus the stepsize decoded from stepsize bit-stream 18, the sign being determined by audio bit-stream 17.

The stepsize bit-stream decoding is as follows: Stepsize bit-stream 18 passes first through D-A converter 23, and then it is bandwidth limited by filter 30 to produce a smoothed analog signal that varies as the duty cycle of stepsize bit-stream 18. The bandwidth limitation takes the form of a three-pole, analog low-pass filter with the transfer function:

$$\left[ \frac{1}{1 + sT_4} \right]^3 \tag{2}$$

where $T_4 = 2$ msec. The analog signal at the output of filter 30 represents the log of the stepsize value, which allows the stepsize to vary over a much wider range (about 8 octaves) than the encoded stepsize bit-stream duty cycle. Exponentiator 26 produces the antilog of the smoothed output of filter 30 and the exponentiator output is the stepsize used by adaptive delta demodulator 22. The stepsize has the characteristic $$ss = V_0 \exp(ky) = V_0 \cdot 2^{10y} \tag{3}$$

where $V_0$ is a scaling factor to suit he design of the audio decoder circuitry, y is the normalized mean level of the stepsize bit-stream as produced by filter 30, and $k = 10\ln 2 = 6.93$.

Post-processing circuitry 25 is an adaptive de-emphasis filter 24 and the decoder for spectral bit-stream 19 comprising D-A converter 27, bandwidth limitation filter 32, and exponentiator 28. The spectral bit-stream decoding is identical to the stepsize decoding. De-emphasis filter 24 and low-pass filter 11 are both analog, requiring precision time constants and a performance level that does not degrade the dynamic range of the decoded audio signal at the output of delta demodulator 22. The de-emphasis filter consists of a fixed filter and a "sliding band" filter which has a pole frequency that varies in response to the output of the spectral bit-stream decoding section. The transfer function of the adaptive de-emphasis filter is:

$$\left[\frac{10sT_1}{1+sT_1} + \frac{1+sT_2}{1+sT_3}\right]^{-1} \quad (4)$$

where $T_2 = 5$ μsec, $T_3 = 50$ μsec, and $T_1$ is variable so that the variable frequency of the sliding band de-emphasis $f_1$ is given by:

$$f_1 = 1/(2\pi T_1) = f_0 \exp(kx) = f_0 \cdot 2^{10x} \quad (5)$$

where x is the normalized mean of spectral bit-stream 19, $k = 10\ln 2 = 6.93$, and $f_0 = 4$ kHz. Lowpass filter 11, which actually forms part of the de-emphasis, has the transfer function $$\frac{1}{1+sT_5} \quad (6)$$

where $T_5 = 25$ μsec.

As shown in FIG. 2, all of the filtering of the prior-art ADM decoder, including the stepsize and spectral bit-stream bandwidth limitation, and the de-emphasis filtering are done in the analog domain, which has the aforementioned drawbacks.

BLOCK DIAGRAM OF DIGITAL ADM DECODER—FIG. 3

The block embodiment of this invention is shown in FIG. 3. Stepsize bit-stream 18 and spectral bit-stream 19 are not converted to an analog value as in FIG. 2, but rather filtered in the digital domain by digital low-pass filters 38 and 40, respectively. The output of filter 38 is a digital representation of the spectral bit-stream duty cycle, while the output of filter 40 is a digital representation of the spectral bit-stream duty cycle. The digital lowpass filters run at a sample rate determined by clock 41. Exponentiator 34, which is fed by digital low-pass filter 38, produces the digital stepsize control signal used in adaptive digital delta demodulator 37. Exponentiator 36, which is fed by digital low-pass filter 40, produces the digital spectral control signal used in digital adaptive de-emphasis filter 39.

Similarly, the adaptive delta-demodulator 37 is a fully digital circuit which accepts audio bit-stream 17, and the digital stepsize from exponentiator 34, producing digital words at its output at the rate of clock 20 which represent the demodulated audio bit-stream as a multi-bit PCM signal. The output of demodulator 37 is sent to digital adaptive de-emphasis filter 39. The output of digital post-processing block 35 is a PCM digital representation of the analog valued signal emerging from analog post-processing 25 in the prior-art decoder of FIG. 2.

Block 33 encloses all of the functions specific to the ADM decoding in the preferred embodiment. Since the output of block 33 is a PCM digital signal, it may be fed directly to other digital processing devices, or converted to analog form as in the preferred embodiment, to produce audio output 12. To achieve this, further digital processing is performed to first convert the sample rate of the signal to a much higher frequency. Up-sampler 42 takes the signal output of post-processor 35 which is at the frequency of clock 20 and produces samples at its output at the higher frequency of clock 50. For a frequency of clock 20 equal to $f_s$, the frequency of clock 50 is chosen to be $nf_s$, where n is typically 16 or 32. Interpolation block 44 is a filter which attenuates spectral images of the signal at the output of up-sampler 42 which are at multiples of the lower sample rate $f_s$ that are not also multiples of the higher sample rate $nf_s$. The interpolation filtering is an integral part of the up-sampling process.

The output of interpolation filter 44 supplies the input to noise shaping circuit 46. The noise shaper acts to apply a characteristic that rises with increasing frequency to the quantization noise of the signal at its bit-stream output, such that the residual noise left in the audio bandwidth is very low. By doing so, simple low-precision single-bit D-A converter 48 can be used to finally develop an analog signal. Delta modulation is exploited again to perform the noise shaping. The spectrum of the analog signal output of D-A converter 48 contains the desired audio signal that was decoded from the audio bit-stream 17 along with quantization noise that rises with increasing frequency due to the noise shaping, and images of the audio signal at multiples of high frequency clock 50, due to the sampled-data nature of the output of D-A converter 48. There are also images of the audio signal at frequencies that are multiples of clock 20; however these are attenuated by the transfer function of interpolation filter 44. Low-pass filter 11, which actually forms part of the spectral de-emphasis filtering, acts to also reduce the level of the high frequency quantization noise and images of the audio signal above the audio band. Its output is recovered analog audio signal 12. For some applications where energy at frequencies above the audio band is not acceptable, low-pass filter 11 may be more complex than a single-pole de-emphasis filter.

Low-pass filter 11 may also be implemented as a digital circuit and combined or cascaded with adaptive de-emphasis 39 without changing the characteristics of the signal in the audio band. However, in the case where low-pass filter 11 is made digitally, there is still a need for further low-pass filtering after D-A converter 48 in order to re-construct the analog signal from the single-bit output. Lowpass filter 11 is left as the last analog block because it can perform dual functions of de-emphasis filtering and re-construction. When the spectral de-emphasis pole frequency is significantly lower than the upper edge of the audio band, attenuation at frequencies between this pole frequency and the upper edge of the audio band is beneficial because it increases the signal-to-noise ratio of the system by further attenuating quantization noise of D-A converter 48.

STEREO DIGITAL ADM DECODER—FIG. 4

In the preferred embodiment, all circuitry except low-pass filter 11 is digital and targeted for integration on a single integrated circuit manufactured with a standard digital process technology. Low-pass filter 11 could be implemented with a switched-capacitor filter to perform the de-emphasis filtering function in some integrated circuit technologies, however a continuous-time low-pass filter would still be required to re-construct the signal at the output of such an implementation. In this case, the continuous-time filter would only be removing images of the audio signal at the multiples of clock 50, and therefore could be lower precision than the de-emphasis filtering, giving the possibility of having the the entire decoder fully integrated.

Unlike analog circuits, there are little or no crosstalk concerns in digital circuit designs. Additionally, with a high enough master clock rate, the amount of processing power of a single set of digital hardware modules can be sufficient to multiplex functions for two or more channels of audio decoding. FIG. 4 shows the preferred embodiment, where, because high quality audio systems normally contain two channels of information for stereo, a single set of digital hardware modules implements two channels of decoding. The functionality of the decoder is partitioned onto three separate digital datapaths. The datapaths are capable of performing a set of operations that is the minimum set to implement the labeled functionality. They also include sufficient memory elements to store intermediate results and filter state variables.

Channel 1 stepsize bit-stream 54 and Channel 1 spectral bit-stream 56 are sent along with Channel 2 stepsize bit-stream 55 and Channel 2 spectral bit-stream 57 to datapath 59, where they are all time multiplexed to a single bit-stream. The time multiplexing allows datapath 59 to perform the low-pass filtering operations on each bit-stream in sequence on the same hardware during a single sample period. Exponentiator 60 performs the required exponentiation of each result of datapath 59, and it supplies digital words representing the stepsize control signal and spectral control signal for each channel to second datapath 58.

Second datapath 58 time multiplexes Channel 1 audio bit-stream 52 and Channel 2 audio bit-stream 53, and performs both the adaptive delta-demodulation and adaptive de-emphasis filtering digitally for each channel. The multiplexed output of second datapath 58 contains the digital representations of the decoded audio signals for each channel. While a single multi-bit digital bus is shown at the output of datapaths 58 and 59 in FIG. 4, they contain the signals for Channel 1 and Channel 2 multiplexed in time.

Third datapath 61 up-samples and interpolates the digital representation for each channel to a higher sample rate, which is sixteen times the audio data rate. A second-order sigma-delta modulator implemented by datapath 61 produces a single-bit bit-stream for each channel with quantization noise that is concentrated at frequencies above the audio band. A single-bit D-A conversion is performed at the output of datapath 61 on the multiplexed bit-stream outputs of the noise shaper, and then the two channel outputs are de-multiplexed to produce Channel 1 D-A output 64 and Channel 2 D-A output 65. Because a single-bit D-A converter simply switches between two output values, it can be implemented with a single digital inverter.

Two instances of lowpass filter 11 act to reconstruct the audio analog signals from the D-A outputs of datapath 61 and they also provide the final spectral de-emphasis to yield Channel 1 audio output 66 and Channel 2 audio output 67.

Master clock 62 is used to synchronize the timing of each operation in the three datapaths. The frequency of clock 62 is high enough to allow a sufficient number of operations on each of the datapaths for performing the required functionality for both channels. The frequency of clock 62 is sixty-four times the audio data rate in the preferred embodiment. The datapaths complete a single operation per cycle of clock 62, and therefore, in the preferred embodiment, there are sixty-four operations that can occur between cycles of the audio bit-rate clock. This allows 32 operations per channel when two channels are multiplexed in time for stereo decoding.

OPERATION

The operation of the digital ADM decoder is identical to that of an analog ADM decoder with the exception that higher frequency clocks must be provided to synchronize the oversampling D-A conversion and the datapath operations. The stereo decoder shown in FIG. 4 will be described. Digital bits from Channel 1 audio bit-stream 52, Channel 1 stepsize bit-stream 54, and Channel 1 spectral bit-stream 56 are clocked into the decoder by clock 20, and Channel 1 audio output 66 is the Channel 1 decoded analog signal. Similarly, Channel 2 audio bit-stream 53, Channel 2 stepsize bit-stream 55, and Channel 2 spectral bit-stream 57 are clocked into the decoder by clock 20, and Channel 2 audio output 67 is the Channel 2 decoded analog signal. Since the bit-stream supplied to low-pass filter 11 is at a rate sixteen times the audio bit-rate, clock 50 must be supplied to the digital decoder at that frequency. In the preferred embodiment shown in FIG. 4, datapaths 58, 59, and 61 perform decoder operations for both channels. In order to perform the number of operations required by the digital filtering, clock 62 is also supplied to the stereo digital decoder at a frequency that is sixty-four times the audio bit-rate. Clock 41 is the sample rate of the digital lowpass filter for the stepsize and spectral bit-streams. In the preferred embodiment, it is the same frequency as audio bit-rate clock 20.

DIGITAL STEPSIZE CONTROL SIGNAL DECODER—FIG. 5

In the preferred embodiment, a 10% change in the normalized average value of either the stepsize or spectral control bit-streams causes a one-octave change in the output of the exponentiator for the associated control bit-stream. FIG. 5 illustrates the preferred implementation of the digital circuit for performing this function, drawn for the stepsize control signal decoding, which comprises digital lowpass filter 38 and exponentiator 34 in FIG. 3. The stepsize bit-stream controls the position of selector 70, which feeds the value 1.25 or 0.00 into digital low-pass filter 38, depending on whether the stepsize bit is a logical "1" or logical "0". By normalizing bit-stream 18 to a value of 1.25 with selector 70, the output of digital low-pass filter 38, which averages the incoming signal, will change by 0.125 for each 10% change in the duty cycle of bit-stream 18. In a binary digital circuit that performs radix-2 arithmetic, it is advantageous to work with numbers that are powers of 2. The output of filter 38 in FIG. 5 changes by $\frac{1}{8}$ or $\frac{1}{8}^{-3}$ for each 10% change in the stepsize bit-stream duty cycle, causing a one octave change in exponentiator output 78. For an eight-octave range, the three most significant bits (MSBs) of the output from filter 38 can be used to select the desired range in output value 78 with selector 74 and multiplier 76.

Exponential output 78 is the digital stepsize control signal used in the adaptive delta demodulation. The normalizing factor of 1.25 described above can also be placed after low-pass filter 38, however digital hardware is simplified by scaling the single-bit bit-stream 18 with selector 70 rather than the multi-bit output of said lowpass filter with a multiplication circuit.

Multiplier 76 is a very simple circuit because only powers of 2 are needed as the multiplier value. Thus, in a digital circuit, simple shifts of the output word towards the MSB implement the multiplication. By range changing, a much smaller table of exponential curve values, covering only a single octave is required to cover the values of the stepsize over an 8 octave range. Lookup table 72 provides the one-octave range of values. The same scheme is used for the spectral bit-stream processing, which comprises digital lowpass filter 40 and exponentiator 36 in FIG. 3.

The preferred embodiment of digital lowpass filter 38, which is identical to digital lowpass filter 40, is shown in FIG. 7, and is described after the next section.

DETAIL OF DIGITAL DEMODULATOR, DE-EMPHASIS—FIG. 6

FIG. 6 shows a detailed digital network for adaptive delta-demodulator 37 and de-emphasis filter 39. The operations of the network are performed in datapath 58 in the preferred embodiment shown in FIG. 4. The delta demodulation is performed by a combination of leaky digital integrator 80 and multiplier 81. The leaky digital integrator transfer function is:

$$\frac{z^{-1}}{1 - m_0 z^{-1}} \tag{7}$$

where z is the complex frequency in the digital domain and $m_0$ is $(1 - t_{CLK}/0.5\ \text{msec})$, $t_{CLK}$ being the period of the audio bit-rate of the system, which is also the frequency of clock 20 shown in FIG. 3. In the figure, a delay $z^{-1}$ is equivalent to the period $t_{CLK}$. Equation 7 describes a function in the digital domain that closely matches the function of an analog delta demodulator described by Equation 1.

The stepsize control signal, which is exponential output 78 of stepsize exponentiator 34 is multiplied by audio bit-stream 17 with multiplier 81 at the input to the digital integrator. Since the binary valued audio bits represent values of either +1 or −1 for the multiplication, the actual digital circuit can implement this with a simple addition or subtraction of the stepsize control signal.

A digital network that closely approximates the de-emphasis filter transfer function of Equation 4 in the digital domain for the preferred embodiment is also shown in FIG. 6. The input of the de-emphasis filter is the output of integrator 80. Adder 83 adds the input with the negative of the feedback path from de-emphasis filter output 88, where the feedback path has the transfer function:

$$m_3 + m_7 \frac{m_6}{1 - z^{-1} + m_6 z^{-1}} \tag{8}$$

In the feedback path, adder 105 adds proportions of the de-emphasis filter output 88 and the output of single-pole lowpass filter 85, which is also fed by de-emphasis filter output 88, to form a shelfing lowpass filter characteristic. The output of adder 105 is the feedback supplied to adder 83.

The feedforward path from adder 83 output to de-emphasis filter output 88 contains scaled delay 82, digital integrator 84 and adder 86. The transfer function of this feedforward path is:

$$m_2 z^{-1} + \frac{m_1 z^{-1}}{1 - z^{-1}} \tag{9}$$

Combining the effects of the transfer functions of Equation 8 and Equation 9 yields the overall transfer function for the digital de-emphasis network:

$$\left[\frac{1}{(m_1 + m_2)z^{-1}}\left(\frac{1 - z^{-1}}{1 - \frac{m_2}{m_1 + m_2}z^{-1}}\right) + m_3\left(\frac{1 - z^{-1} + m_6 z^{-1} + m_6 m_7/m_3}{1 - z^{-1} + m_6 z^{-1}}\right)\right]^{-1} \tag{10}$$

The coefficients of the network are:
$m_2 = 0.100$
$m_3 = 0.100$
$m_6 = t_{CLK}/50\ \mu\text{sec}$
$m_1 = 2\pi f_1 \cdot t_{CLK}/10.0$ for $f_1$ as defined above in Equation 5. $t_{CLK}$ is the period of the sample rate of the digital filters which is typically equal to the audio bit-stream data rate.

Lowpass filter 11 shown in FIG. 3 is the same as in the FIG. 2 embodiment of the Todd and Gundry system, and its transfer function is:

$$\frac{1}{1 + sT_5} \tag{11}$$

where $T_5 = 25\ \mu\text{sec}$.

STEPSIZE AND SPECTRAL LOWPASS FILTERS—FIG. 7

FIG. 7 shows a digital low-pass filter network for the preferred embodiment which has a frequency response that closely approximates the transfer function of Equation 2 in the audio band. It is appropriate for filters 38 and 40 in the block embodiment shown in FIG. 3, and the operations of the network are performed by datapath 59 in FIG. 4. Its transfer function is:

$$\left[\frac{m_4 z^{-1}}{1 - z^{-1} + m_4 z^{-1}}\right]^3 \tag{12}$$

with $m_4 = t_{CLK}/2$ msec, being the sampling frequency of the digital bandwidth limitation filter (the period equal to one $z^{-1}$ delay). The digital low-pass filter is made up of three identical sections. In the first section, the input 90 is added with the negative of first section output 94 in adder 89. First adder output 91 is multiplied by coefficient $m_4$ and added in adder 92 with first section output 94. The output of adder 92 is delayed one sample period by delay 93 before becoming first section output 94. In the second section, the input, which is first section output 94, is added with the negative of second section output 99 in adder 95. Adder output 96 is multiplied by coefficient $m_4$ and added with second section output 99 in adder 97. The output of adder 97 is delayed one sample period by delay 98 before becoming second section output 99. In the third section, the input, which is second section output 99, is added with the negative of third section output 104 in adder 100. Adder output 101 is multiplied by coefficient $m_4$ and added with third section output 104 in adder 102. The output of adder 102 is delayed one sample period by delay 103 before becoming third section output 104. The output of the digital low-pass filter is third section output 104.

OVERSAMPLING D-A CONVERSION

The oversampling D-A conversion of the output of digital post-processing 35 begins with up-sampler 42 which converts the sample rate to a frequency that is sixteen times audio data-rate clock 20 in the preferred embodiment. Interpolation filter 44 repeats each sample from post-processor 35 exactly sixteen times, implementing a "zeroth-order hold", having the transfer function:

$$\frac{1 - z^{-16}}{1 - z^{-1}} \quad (13)$$

where $z^{-1}$ in the above equation is the period of the oversampling clock 50 in FIG. 3, its frequency being sixteen times the frequency of audio bit-rate clock 20. Strictly speaking, up-sampler 42 would fill samples of high frequency clock 50 that occur between samples of clock 20 with zero samples, and interpolation filter 44 would hold the non-zero samples of up-sampler 42 sixteen times to achieve the filtering. In the actual circuit implementation, the up-sampling operation would be combined with interpolation filter 44 in a single circuit.

If more attenuation of the images of the signal at multiples of the audio bit-rate is required, linear interpolation or a "first-order hold" circuit can be used where output samples w are related to input samples v by the equation below:

$$w_{16m+n+1} = w_{16m+n} + \frac{1}{16}(v_{m+1} - v_m) \quad (14)$$

The corresponding transfer function of the linear interpolation is:

$$\left[\frac{1 - z^{-16}}{1 - z^{-1}}\right]^2 \quad (15)$$

Use of either of the two implementations of interpolation 44 described above, or higher-order filtering functions are considered within the scope of this invention.

Noise shaping block 46 in the preferred embodiment is implemented with a sigma-delta modulator network by datapath 61 of FIG. 4. At the input to the ADM decoder, audio bit-stream 17 is an oversampled digital representation of the encoded audio signal with a typical oversampling ratio of about four octaves. Up-sampler 42 and interpolation filter 44 run at the higher frequency of clock 50, which provides another 4 octaves (factor of 16) of oversampling. With a total eight octave oversampling ratio, second order sigma-delta modulation can be employed in noise shaper 46 to obtain a dynamic range for the decoder output of about 100 dB. Second-order modulators achieve a signal-to-noise ratio of about 15 dB/octave of oversampling at their output.

NOISE SHAPING NETWORK—FIG. 8

A suitable digital network for implementing a second-order noise shaping sigma-delta modulator is shown in FIG. 8. Digital integrators 110 and 112 work in combination to achieve the second-order rising response to the quantization noise of quantizer 114 at the noise shaper output 118. Input 106 is connected to the output of interpolation filter 44. The modulator operates at the frequency of clock 50, the period of which is also equal to the $z^{-1}$ delays shown in integrators 110 and 112. While the noise shaping network in FIG. 8 is suitable for the preferred embodiment, noise shaper 46 is not limited to this network or architecture. Any network which sufficiently shapes the noise of the single-bit output bit-stream of the ADM decoder to meet the system specifications is considered within the scope of the invention, including higher order noise shapers. Other examples of second-order sigma-delta noise shaping networks can be found in J. C. Candy, "A Use of Double Integration in Sigma-Delta Modulation," *IEEE Trans. Commun.*, Vol. COM-33, March 1985, pp. 249–258, M. W. Hauser and R. W. Brodersen, "Circuit and Technology Considerations for MOS Delta-Sigma A/D Converters," *Proc. of ISCAS*, May 1986, pp. 1310–1315, P. Defraeye, D. Rabaey, W. Roggeman, J. Yde, and L. Kiss. "A 3-μm CMOS Digital CODEC with Programmable Echo Canceller and Gain Setting," *IEEE J. Solid State Circuits*, Vol. SC-20, No. 3, June 1985, pp. 679–687, and N. S. Lin, B. Fraenkel, G. M. Jacobs, L. Yiu, D. Senderowicz, and R. Ulmer, "Sigma-Delta A/D and D/A for High-Speed Voiceband Modems," *Proc. of ICASSP*, Glasgow, Scotland, May 1989.

The output of noise shaper 46 is applied to 1-bit D-A converter 48 to produce the bit-stream output of the digital ADM decoder. The converter simply switches the output between two output levels, typically a circuit reference voltage and the common Ground voltage.

CIRCUIT APPLICATION—FIG. 9

In the preferred embodiment, all of the circuitry for a stereo decoder with the exception of low-pass filter 11 are implemented digitally and contained on a single integrated circuit. The oversampling output is at the frequency of clock 50, which is sixteen times the audio bit-rate determined by clock 20. Operations in the digital datapaths are synchronized by clock 62 which runs at a rate that is sixty-four times the audio bit rate.

FIG. 9 shows a schematic for a stereo decoder which employs the preferred embodiment. Because most of the circuitry is contained on a single integrated circuit, the only external components consist of two instances of low-pass filter 11. The first is connected to Channel 1 D-A output 64 and produces Channel 1 audio output 66. The second is connected to Channel 2 D-A output 65 and produces Channel 2 audio output 67. Low-pass filter 11 is comprised of resistor 125 and capacitor 126 which has one side connected to the circuit reference or "Ground" voltage. The R-C time constant of resistor 125 and capacitor 126 is 25 μsec. Low-pass filter 11 for Channel 2 has the same component values as for Channel 1. Clock divider 120 takes master clock 62 and divides it by a factor of four to generate clock 50. Clock 50 is further divided by sixteen to generate audio bit-rate clock 20. The divider circuits are digital also, and would normally be combined with the ADM decoder circuitry on integrated circuit 124. The number of external components required is shown to be very low, which reduces the cost of production and testing.

Differences in the switching characteristics of pull-up and pull-down devices of integrated circuit technologies that could be used for implementing the preferred embodiment can potentially cause distortion to occur in one-bit D-A outputs 64 and 65. To alleviate this problem, each D-A converter can supply two separate outputs driven in anti-phase, the difference of the two outputs being applied to low-pass filter 11. The action of taking a difference cancels to the first order, distortions caused by unequal rise and fall times at each output.

TRANSMISSION SYSTEM RECEIVER—FIG. 10

The advantages of a digital ADM decoder are further exemplified by looking at the decoder's place in a digital transmission system receiver. FIG. 10 shows an illustration of a digital transmission system receiver containing the stereo ADM decoding function. In this example the signal is sent over transmission medium 138 using radio-frequency (RF) modulation. RF converter 130 converts the signal received from transmission medium 138 to lower frequency baseband signal 137. Additional digital circuits for demodulating baseband signal 137, demultiplexing the different audio channels contained in the broadcast signal, and clock generation are integrated on single integrated circuit 128 along with the preferred embodiment of the stereo digital ADM decoder.

User interface 132 allows the consumer of the receiver to select the desired audio channel, control volume, etc., and it sends control information 133 to integrated circuit 128 also.

After demodulation and demultiplexing, ADM bit-streams 139 for two channels are produced and sent to the ADM decoder portion of integrated circuit 128. While bit-streams 139 are shown external to the chip for clarity, they would normally connect between the ADM decoder and the additional circuits without any external connections. Audio output 66 for Channel 1 and audio output 67 for Channel 2 are fed to stereo amplifier 135 to generate signals with enough power to drive left speaker 134 and right speaker 136.

In this example, the digital implementation of the ADM decoder not only reduces the number of external components, it allows a higher level of integration of the entire receiver, by coexisting on the same integrated circuit with additional circuits.

SUMMARY, RAMIFICATIONS, AND SCOPE

Accordingly, the reader will see that the digital conversion circuit uses mostly digital circuitry to perform the functions of an ADM decoder. Digital filtering, as utilized for the control bit-stream and de-emphasis filters, requires no external components because time constants are defined by operations that are fractions of the master clock frequency of the circuit. The clock frequency is usually crystal controlled and extremely accurate (within tens of parts per million), and the accuracy of the fractions can be arbitrarily chosen during circuit design to meet the specifications. Once designed, the filter time constants can never drift and they require no special production accuracy testing like their analog component counterparts.

The digital ADM decoder partitions the decoder functions in a novel way. Delta modulation systems have been traditionally exploited as a means for coding signals requiring a lower bit rate than PCM, and for the simple decoder hardware. In the case of a high quality digital audio system, the additional signal processing required to obtain high performance makes the overall decoder hardware more complex. This invention first converts the ADM bit-stream to PCM format, rather than decoding to analog form directly. The PCM output of the demodulator can then be processed by other signal processing circuits and eventually converted to produce the analog output by a PCM D-A converter. The conversion to PCM, actually results in a more cost-effective and better performing overall decoder implementation. The cost of converting the PCM back to analog form remains low if oversampling delta modulation techniques are exploited fully.

When a high enough clock frequency is available, the decoder architecture allows several channels of digital audio data to be decoded on the same set of hardware modules, which increases the efficiency, and lowers the cost of the implementation even further. The digital portion of the decoder produces a one-bit oversampled representation of the decoded signal, which when low-pass filtered, is the final analog output signal. The data converter of this invention almost entirely a digital circuit, allowing its integration in a standard digital integrated circuit process along with other system functions on the same die. In turn, since other digital functions are normally required in the digital transmission systems where the decoder is employed, the decoder can be combined with those other functions on a single integrated circuit, thereby significantly reducing the parts count, parts cost, packaging costs, and printed circuit board space requirements of the system.

The benefits of the digital decoder are extensible to any application which uses delta modulation coding and requires signal processing to be performed on the decoded signal as part of the system design. Examples include telephone systems or voice messaging systems, where it is also desirable to obtain good quality audio at a reduced bit rate. Additionally, the digital method for decoding ADM signals can be implemented as a program on a general-purpose digital signal processing (DSP) chip, rather than using a specifically designed integrated circuit for the function. While this would be a more costly implementation than the preferred embodiment, it could be suitable for systems with existing DSP chips that perform other tasks.

While the preferred embodiment has been shown and described, variations will occur to those skilled in the art. Accordingly, the full scope of the invention should be determined by the appended claims and their legal equivalents, and not by the examples given.

I claim:

1. A decoder for generating an analog signal from a digital representation thereof, said digital representation having been produced by an encoder which encodes an input signal of limited bandwidth into a delta modulation bit-stream at a sample rate, and stepsize information, said input signal having been encoded in accordance with said stepsize information to produce said delta modulation bit-stream, comprising:

(a) digital circuit means for decoding said stepsize information into a digital stepsize control signal, (b) digital demodulator means for converting said delta modulation bit-stream into a multi-bit intermediate digital signal in response to said stepsize control signal, such that said multi-bit intermediate digital signal represents said analog signal in a pulse code modulation format, (c) digital-to-analog converter means for converting said multi-bit intermediate digital signal into a sampled analog signal, and (d) low-pass filter means connected to the output of said digital-to-analog converter means for producing said analog signal from said sampled analog signal, whereby said analog signal will be substantially similar to said input signal.

2. The decoder of claim 1 wherein said digital demodulator means comprises a digital adaptive delta demodulator.

3. The decoder of claim 1 wherein said digital demodulator means comprises a digital delta demodulator and level changing means for changing the level of said analog signal as a function of said digital stepsize control signal.

4. The decoder of claim 3 wherein said digital delta demodulator is arranged to apply a substantially fixed stepsize, and wherein said level changing means applies a variable gain to said multi-bit intermediate digital signal to modulate the level of said analog signal.

5. The decoder of claim 3 wherein said level changing means adjusts the stepsize of said digital delta demodulator as a function of said digital stepsize control signal.

6. The decoder of claim 3, further including a volume control input, wherein said level changing means applies a variable gain to said multi-bit intermediate digital signal to modulate the level of said analog signal as a function of both said digital stepsize control signal and said volume control input, whereby a single level changing means is used in said digital demodulator and for the purpose of externally adjusting the volume of said analog signal.

7. The decoder of claim 1 wherein said digital-to-analog converter means comprises:

(a) sample rate conversion means for converting the sample rate of said multi-bit intermediate digital signal to a higher sample rate, thereby producing an oversampled digital signal, (b) noise shaping means for converting said oversampled digital signal to a noise-shaped digital signal having a resolution of fewer bits than the resolution of said multi-bit intermediate digital signal, such that the quantization noise of said noise-shaped digital signal is spectrally shaped to be concentrated substantially at frequencies above the bandwidth of said input signal, and (c) low-resolution digital-to-analog converter means for converting said noise-shaped digital signal to said sampled analog signal, whereby said low-resolution digital-to-analog converter means requires less precision analog circuitry than a digital-to-analog converter having resolution similar to that of said multi-bit intermediate digital signal, and the frequency response of said low-pass filter requires less attenuation at said sample rate.

8. The decoder of claim 7 wherein said noise shaping means includes delta modulation means.

9. The decoder of claim 7 wherein (a) said noise-shaped digital signal is a one-bit bit-stream, and (b) said low-resolution digital-to-analog converter means has one-bit resolution, such that said sampled analog signal is a two-valued signal.

10. The decoder of claim 9, further including second one-bit digital-to-analog converter means and differencing means, wherein said second one-bit digital-to-analog converter means produces a second two-valued signal in anti-phase from said two-valued signal, and said differencing means passes the difference between said two-valued signal and said second two-valued signal through said low-pass filter means to produce said analog signal, whereby distortion in said analog signal resulting from one-bit digital-to-analog conversion is reduced.

11. The decoder of claim 1, further including digital filter means and a spectral control input, wherein said digital filter means adjusts the spectral content of said intermediate digital signal to adjust the spectral content of said analog signal in response to a signal at said spectral control input, whereby the spectral content of said analog signal is externally adjustable.

12. The decoder of claim 1, further including multiplexing means for multiplexing a plurality of said digital representations into a single time-multiplexed digital representation connected to the input of said decoder, and demultiplexing means for time-demultiplexing said multi-bit intermediate digital signal into a plurality of multi-bit intermediate digital signals, each of said plurality of multi-bit intermediate digital signals connected to one of a plurality of said digital-to-analog converter means connected to a plurality of said low-pass filter means, producing a plurality of said analog signals, whereby the decoding of said plurality of said digital representations share processing elements within a single said decoder.

13. The decoder of claim 12 wherein at least one of said multiplexing means, said digital circuit means, said digital demodulator means, said demultiplexing means, said plurality of said digital-to-analog converter means, and said plurality of said low-pass filter means comprises an integrated circuit.

14. The decoder of claim 1, further including sample rate conversion means and a digital output port, such that the sample rate of said multi-bit intermediate digital signal is converted by said sample rate conversion means to at least one of a plurality of standard sample rates and supplied to said digital output port, whereby said digitial output port may be connected to a plurality of standardized equipment for further digital processing including recording onto a digital storage medium, transmission, filtering, and digital-to-analog conversion.

15. A decoder for generating an analog signal from a digital representation thereof, where said digital representation is produced by an encoder that passes an input signal having a limited bandwidth through a variable spectral pre-emphasis to produce a pre-emphasized signal, and encodes said pre-emphasized signal into (a) a delta modulation bit-stream at a sample rate, said delta modulation bit-stream representing said pre-emphasized signal, (b) a stepsize bit-stream representing a variable stepsize applied in the production of said delta modulation bit-stream, and (c) a spectral bit-stream representing the bandwidth of said variable spectral pre-emphasis, comprising:

(a) first digital circuit means for decoding said stepsize bit-stream into a stepsize control signal, (b) second digital circuit means for decoding said spectral bit-stream into a spectral control signal, (c) digital demodulator means for converting said delta modulation bit-stream into a multi-bit intermediate digital signal in response to said stepsize control signal, said multi-bit intermediate digital signal representing said pre-emphasized signal in a pulse code modulation format, (d) digital de-emphasis filter means having a bandwidth that varies in response to said spectral control signal connected to the output said digital demodulator means for producing a de-emphasized digital signal, (e) digital-to-analog converter means for converting said de-emphasized digital signal into a sampled analog signal, and (f) low-pass filter means connected to the output of said digital-to-analog converter means for producing said analog signal from said sampled analog signal, whereby said analog signal will be substantially similar to said input signal.

16. The decoder of claim 15 wherein said digital demodulator means comprises a digital delta demodulator and level changing means for changing the level of said analog signal as a function of said digital stepsize control signal.

17. The decoder of claim 16, further including a volume control input, wherein said level changing means applies a variable gain to said multi-bit intermediate digital signal to modulate the level of said analog signal as a function of both said digital stepsize control signal and said volume control input, whereby a single level changing means is used in said digital demodulator and for the purpose of externally adjusting the volume of said analog signal.

18. The decoder of claim 15 wherein said sample rate is $f_{CLK}$, and said digital delta demodulator has the following transfer function:

$$\frac{z^{-1}}{1 - m_0 z^{-1}}$$

where $m_0$ is about $$\left(1 - \frac{1}{f_{CLK} \cdot 0.5 \text{ millisecond}}\right),$$

and z is the complex frequency in the digital domain.

19. The decoder of claim 15 wherein said first digital circuit means for decoding said stepsize bit-stream comprises:

(a) a first digital filter for limiting the bandwidth of said stepsize bit-stream, and (b) a first digital exponentiator connected to the output of said first digital filter circuit so as to produce said stepsize control signal which varies as the antilog of said output of said first digital filter circuit, and wherein said second digital circuit means for decoding said spectral bit-stream value comprises:

(a) a second digital filter for limiting the bandwidth of said spectral bit-stream, and (b) a second digital exponentiator connected to the output of said second digital filter circuit so as to produce said spectral control signal which varies as the antilog of said output of said second digital filter circuit.

20. The decoder of claim 19 wherein said first and said second digital filters comprise three serially connected single pole filters, each with a sample period $t_{CLK}$ and the following transfer function:

$$\frac{m_4 z^{-1}}{1 - z^{-1} + m_4 z^{-1}}$$

where $m_4$ is about $t_{CLK}/2$ millisecond, and z is a the complex frequency in the digital domain.

21. The decoder of claim 15 wherein said digital de-emphasis filter means comprises a digital filter having a sample period $t_{CLK}$ and transfer function:

$$\left[\frac{1}{(m_1 + m_2)z^{-1}}\left(\frac{1 - z^{-1}}{1 - \frac{m_2}{m_1 + m_2}z^{-1}}\right) + m_3\left(\frac{1 - z^{-1} + m_6 z^{-1} + m_6 m_7/m_3}{1 - z^{-1} + m_6 z^{-1}}\right)\right]^{-1}$$

where $m_2$ is about 0.1,
$m_3$ is about 0.1,
$m_7$ is about 0.9,
$m_6$ is about $t_{CLK}/50$ microseconds,
$m_1$ is about $2\pi f_1 \cdot t_{CLK}/10$,
$f_1 = f_0 \cdot 2^{10x}$,
x is the normalized mean of said spectral bit-stream,
$f_0$ is about 4 kiloHertz, and
z is a the complex frequency in the digital domain.

22. The decoder of claim 15 wherein said digital-to-analog converter means comprises:

(a) sample rate conversion means for converting the sample rate of said multi-bit intermediate digital signal to a higher sample rate, thereby producing an oversampled digital signal, (b) noise shaping means for converting said oversampled digital signal to a noise-shaped digital signal having a resolution of fewer bits than the resolution of said multi-bit intermediate digital signal, such that the quantization noise of said noise-shaped digital signal is spectrally shaped to be concentrated substantially at frequencies above the bandwidth of said input signal, and (c) a low-resolution digital-to-analog converter for converting said noise-shaped digital signal to said sampled analog signal, whereby the complexities of said low-resolution digital-to-analog converter and said low-pass filter means are reduced over that of a digital-to-analog converter with the resolution of said multi-bit intermediate digital signal and a low-pass filter rejecting frequencies lower than said higher sample rate.

23. The decoder of claim 22 wherein (a) said noise-shaped digital signal is a one-bit bit-stream, and (b) said low-resolution digital-to-analog converter has one-bit resolution, such that said sampled analog signal is a two-valued signal, and further including second one-bit digital-to-analog converter means and differencing means, wherein said second one-bit digital-to-analog converter means produces a second two-valued signal in anti-phase from said two-valued signal, and said differencing means passes the difference between said two-valued signal and said second two-valued signal through said low-pass filter means to produce said analog signal, whereby distortion in said analog signal resulting from one-bit digital-to-analog conversion is reduced.

24. The decoder of claim 15 wherein at least one of said first digital circuit means, said second digital circuit means, said digital demodulator means, said digital de-emphasis filter means, said digital-to-analog converter means, and said low-pass filter means comprises an integrated circuit.

25. A method for generating an analog signal from a digital representation thereof, said digital representation including a delta modulation bit-stream at a sample rate, and stepsize information, said delta modulation bit-stream representing an input signal having a limited bandwidth, wherein said input signal has been encoded in accordance with said stepsize information to produce said delta modulation bit-stream, comprising the steps of:

(a) decoding said stepsize information into a digital stepsize control signal, (b) demodulating said delta modulation signal in response to said digital stepsize control signal, so as to produce a multi-bit intermediate digital signal representing said analog signal in a pulse code modulation format, (b) converting said multi-bit intermediate digital signal into a sampled analog signal, and (c) low-pass filtering said sampled analog signal to produce said analog signal, whereby said analog signal will be substantially similar to said input signal.

26. The method of claim 25 wherein said demodulating comprises digital adaptive delta demodulation.

27. The method of claim 25 wherein said demodulating comprises digital delta demodulation and changing the level of said analog signal as a function of said digital stepsize control signal.

28. The method of claim 25, further including the step of filtering said multi-bit intermediate digital signal for the purpose of changing its spectral content prior to said converting said multi-bit intermediate digital signal into said sampled analog signal.

29. The method of claim 25 wherein said converting comprises the steps of:

(a) up-sampling said multi-bit intermediate digital signal at a first sample rate to a higher sample rate to produce an oversampled digital signal, (b) interpolating said oversampled digital signal at said higher sample rate to produce an interpolated digital signal with attenuated images at multiples of said first sample rate that are not also multiples of said higher sample rate, (c) noise shaping and quantizing said interpolated digital signal to produce a lower resolution digital signal at said higher sample rate, such that the quantization noise of said lower resolution digital signal is spectrally shaped to be concentrated substantially at frequencies above the bandwidth of said input signal, and said lower resolution digital signal has fewer bits of resolution than said multi-bit intermediate digital signal, and (d) digital-to-analog converting said lower resolution digital signal into said sampled analog output signal.

whereby said converting requires lower precision analog circuitry than converting said multi-bit intermediate digital signal to said sampled analog signal directly, and said low-pass filtering requires less attenuation at said first sample rate.

30. The method of claim 29, further including the steps of:

(a) time-multiplexing a plurality of said digital representations into a single time-multiplexed digital representation for said decoding, said demodulating said up-sampling, said interpolating, said noise shaping, and said quantizing, (b) time-demultiplexing said lower resolution digital signal into a plurality of lower resolution digital signals, (c) said digital-to-analog converting and said low-pass filtering said plurality of lower resolution digital signals to produce a plurality of said analog signals, whereby the decoding of said plurality of said digital representations into said plurality of said analog signals shares processing elements.

31. The method of claim 25, further including the steps of converting the sample rate of said multi-bit intermediate digital signal to a standardized sample rate to produce a standard digital signal, and supplying said standard digital signal to a digital output port, whereby said digitial output port may be connected to a plurality of standardized equipment for other digital processing, including recording onto a digital storage medium, transmission, filtering, and digital-to-analog conversion.

* * * * *

UNITED STATES PATENT AND TRADEMARK OFFICE
CERTIFICATE OF CORRECTION

PATENT NO. : 5,155,743

DATED : October 13, 1992

INVENTOR(S) : Gordon M. Jacobs

Page 1 of 2

It is certified that error appears in the above-indentified patent and that said Letters Patent is hereby corrected as shown below:

FIG. 6 should be as shown below :

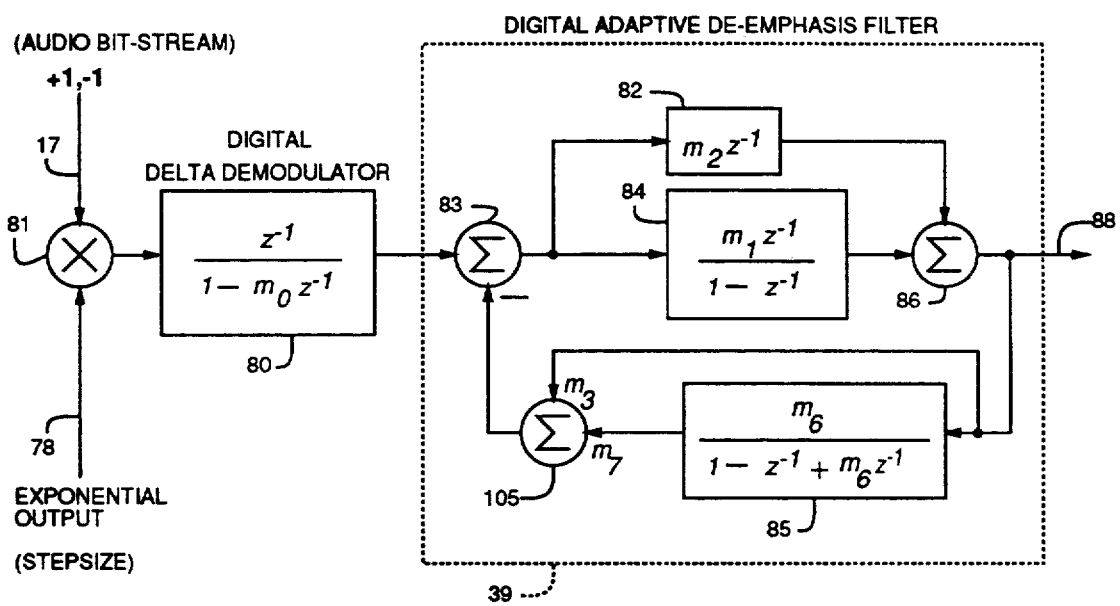

FIG._6

UNITED STATES PATENT AND TRADEMARK OFFICE
CERTIFICATE OF CORRECTION

PATENT NO. : 5,155,743
DATED : October 13, 1992
INVENTOR(S) : Gordon M. Jacobs

It is certified that error appears in the above-identified patent and that said Letters Patent is hereby corrected as shown below:

Col. 14, between lines 28-29 insert $--m_7 = 0.900--$; and

Col. 14, line 57 "$t_{CLK}$/2msec, being" should be $--t_{CLK}$/2msec, $t_{CLK}$ being$--$; and Signed and Sealed this Twelfth Day of October, 1993

Attest:

BRUCE LEHMAN

*Attesting Officer*   Commissioner of Patents and Trademarks